United States Patent
Schnetter et al.

(10) Patent No.: US 10,649,046 B2
(45) Date of Patent: May 12, 2020

(54) CALCULATION OF STIMULATION VALUES IN MAGNETIC RESONANCE TOMOGRAPHY

(71) Applicants: Volker Schnetter, Nürnberg (DE); Daniel Nico Splitthoff, Erlangen (DE)

(72) Inventors: Volker Schnetter, Nürnberg (DE); Daniel Nico Splitthoff, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 424 days.

(21) Appl. No.: 15/440,528

(22) Filed: Feb. 23, 2017

(65) Prior Publication Data
US 2017/0248664 A1 Aug. 31, 2017

(30) Foreign Application Priority Data
Feb. 29, 2016 (DE) .................. 10 2016 203 254

(51) Int. Cl.
*G01R 33/28* (2006.01)
*G01R 33/54* (2006.01)
*G01R 33/385* (2006.01)

(52) U.S. Cl.
CPC ......... *G01R 33/288* (2013.01); *G01R 33/543* (2013.01); *G01R 33/385* (2013.01)

(58) Field of Classification Search
USPC ..................... 324/300–322; 600/407–435; 382/128–131
See application file for complete search history.

(56) References Cited

U.S. PATENT DOCUMENTS

| 5,122,748 | A  | * | 6/1992 | Oh ..................... | G01R 33/4833 |
|---|---|---|---|---|---|
|  |  |  |  |  | 324/307 |
| 6,169,403 | B1 | * | 1/2001 | Hebrank .................. | A61N 2/02 |
|  |  |  |  |  | 324/309 |
| 6,516,213 | B1 | * | 2/2003 | Nevo ...................... | A61B 5/06 |
|  |  |  |  |  | 600/410 |
| 7,412,278 | B2 | * | 8/2008 | Harvey .................. | A61B 5/055 |
|  |  |  |  |  | 324/307 |

(Continued)

FOREIGN PATENT DOCUMENTS

DE 102014202183 A1 8/2015

OTHER PUBLICATIONS

German Office Action for German Application No. 102016203254.2, dated Sep. 7, 2017.
Norme Internationale IEC 60601-2-33, Edition 3.0; 2010.

*Primary Examiner* — Daniel R Miller
(74) *Attorney, Agent, or Firm* — Lempia Summerfield Katz LLC (57) ABSTRACT

The disclosure relates to simulating an electrical stimulation during an examination of an examination object, in which the examination object is examined in a MR system to create a MR image using an imaging sequence, where a time characteristic of at least one magnetic field gradient used during the imaging sequence is determined, a time derivative of the time characteristic of the at least one magnetic field gradient is determined, and change time points at which the value of the time derivative changes are determined. The simulation of the electrical stimulation for the imaging sequence is performed, wherein the simulation is restricted to the determined change time points.

17 Claims, 4 Drawing Sheets

(56) References Cited

U.S. PATENT DOCUMENTS

| | | | |
|---|---|---|---|
| 7,791,338 B2* | 9/2010 | Kim ..................... | G01R 33/561 |
| | | | 324/307 |
| 2007/0010737 A1* | 1/2007 | Harvey ................. | A61B 5/055 |
| | | | 600/416 |
| 2009/0069664 A1* | 3/2009 | Kim ..................... | G01R 33/561 |
| | | | 600/410 |
| 2015/0219736 A1 | 8/2015 | Niederlöhner et al. | |
| 2017/0248664 A1* | 8/2017 | Schnetter ............. | G01R 33/288 |

* cited by examiner

CALCULATION OF STIMULATION VALUES IN MAGNETIC RESONANCE TOMOGRAPHY

The application claims the benefit of German Patent Application No. DE 10 2016 203 254.2, filed Feb. 29, 2016, which is hereby incorporated by reference in its entirety.

TECHNICAL FIELD

The present disclosure relates to a method for simulation of an electrical stimulation during the examination of an examination object. The disclosure further relates to the associated magnetic resonance system and to a computer program product and an electronically readable data carrier.

BACKGROUND

During imaging using magnetic resonance systems a peripheral stimulation of the nerves or heart may occur because of the gradient fields, if an imaging sequence with large magnetic field gradient changes is used. To prevent the stimulation, standardization bodies, for example ISO 60601-2-33, have called for limit values for the stimulation.

U.S. Pat. No. 6,169,403 B1 describes a method for predicting the stimulation value prior to a measurement and for monitoring it during a measurement. In this case, a magnetic flux vector differentiated by time is filtered multiple times per spatial direction, combined in a weighted manner, and evaluated against a limit. Mathematically, the filtering is effected by a convolution of the time characteristic of the time derivative with an e-function. Because of the computation rate, the convolution takes place by an iteration. During the iteration, the current filter value for the further processing is calculated at each time point from the preceding filter value. Because the calculation of whole measuring cycles during imaging has previously taken a very long time, the determination of the stimulation value has been restricted to the gradient sequence which would generate the highest stimulation. For safety reasons, a safety margin may additionally likewise be applied, which reduces the maximally permitted time derivative of the magnetic field gradients.

SUMMARY AND DESCRIPTION

The scope of the present disclosure is defined solely by the appended claims and is not affected to any degree by the statements within this description. The present embodiments may obviate one or more of the drawbacks or limitations in the related art.

It is an object of the present disclosure to expedite such a simulation of the stimulation limits.

According to the disclosure, a method for simulation of an electrical stimulation during an examination of an examination object is provided, in which the examination object is examined in a magnetic resonance (MR) system to create a MR image using an imaging sequence. A time characteristic of at least one magnetic field gradient used during the imaging sequence is determined. Furthermore, a time derivative of the time characteristic of the at least one magnetic field gradient is determined. Finally, the change time points at which the derivative of the time characteristic changes are determined. The simulation of the electrical stimulation is carried out during the imaging sequence, the simulation being restricted to the determined change time points.

By restricting the simulation to the change time points at which the time derivative of the magnetic field changes, the procedure during most imaging sequences may be significantly expedited, because many fewer simulation steps are performed. In most imaging sequences, many magnetic field gradients are not switched at all over the time span of the whole imaging sequence, or the time derivative of the gradient characteristics is constant over a longer time span, before the time derivative of the gradients changes again. This means the change time points at which the time derivative of the magnetic field changes and is not zero are very few. The changes of the time derivatives are relatively rare, so that during planning for a measurement, a simulation is possible at all change time points.

The simulation may include a calculation of the electrical stimulation. During the calculation, this is restricted to the particular change time points. It is possible for a current stimulation value to be calculated from a preceding stimulation value during the calculation. Here the calculation of the current stimulation value may then be restricted to the determined change time points.

It is possible to perform the simulation for the entire time characteristic of the imaging sequence in all gradient directions. A restriction to regions of the imaging sequence in which the highest simulation values are expected is no longer necessary.

The simulation of the electrical stimulation may be based on the following formula:

$$f_n = \dot{B} + \left(e^{\frac{-\Delta t}{\tau}}\right)^i (f_{n-i} - \dot{B})$$

Here $f_n$ designates the electrical stimulation at the change time point n, $\Delta t$ is a predefined time step, $\tau$ is a predefined time constant, $f_{n-i}$ designates the electrical stimulation at the preceding change time point, and $\dot{B}$ describes the time derivative of the magnetic field gradient.

This formula may be simplified by assuming that the exponential function used in the formula is approximated by a first-order function:

$$e^x = 1 + \frac{x}{1!} + \ldots$$

$$f_n = \dot{B} + \left(1 - \frac{\Delta t}{\tau}\right)^i (f_{n-i} - \dot{B})$$

This formula may be further simplified by assuming that $\Delta t/\tau$ is significantly smaller than 1, giving the following formula:

$$f_n = \dot{B} + \left(1 - \frac{i\Delta t}{\tau}\right)(f_{n-i} - \dot{B})$$

The simulation may be performed when setting the imaging parameters that are used during the imaging sequence. Here the simulation may be concluded before adjustment measurements are made, in which an influence of the examination object on a measurement field in which the MR signals are measured may be taken into account.

It is possible for a plurality of imaging parameters to be set during the imaging sequence used. After setting a first imaging parameter, the simulation may be started and performed automatically, it being concluded before the last imaging parameter has been set.

The disclosure further relates to the associated magnetic resonance system that may have a computing unit designed to perform the above-mentioned acts.

BRIEF DESCRIPTION OF THE DRAWINGS

The disclosure is explained in greater detail below with reference to the annexed drawings.

FIG. 3 depicts by way of example an imaging sequence with magnetic field gradients and the time derivative to illustrate which change time points the simulation may be restricted to.

FIG. 5 depicts a section from FIG. 3 to clarify which time points the simulation may be restricted to.

DETAILED DESCRIPTION

Figure 1:
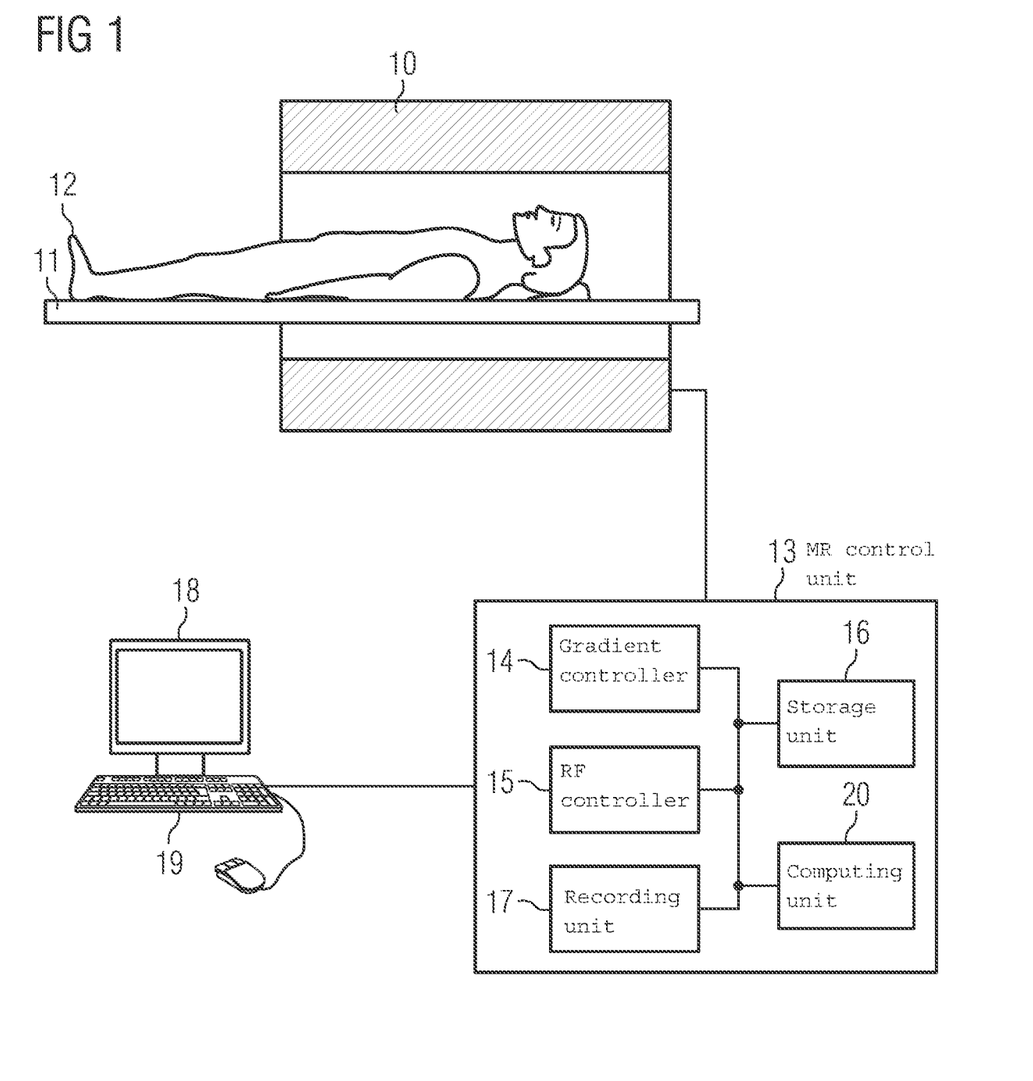
FIG. 1 schematically depicts an example of a MR system, with which the simulation of the stimulation may be performed.

FIG. 1 schematically depicts a MR system, with which the simulation of an electrical stimulation may be performed on an expedited basis. The MR system has a magnet 10 for generating a polarization field B0, wherein an examination person 12 arranged on a couch 11 is moved into the center of the magnet, in order to be able to record spatial encoded magnetic resonance signals from an examination section. By irradiating radio-frequency pulse sequences and switching magnetic field gradients, the magnetization generated by the polarization field may be deflected from the equilibrium position, and the resulting magnetization may be converted into magnetic resonance signals using receiver coils (not shown).

The magnetic resonance system also has a MR control unit 13 used for controlling the MR system. The central MR control unit 13 has a gradient controller 14 for controlling and switching the magnetic field gradients, and an RF controller 15 for controlling and irradiating the RF pulses to deflect the magnetization from the equilibrium position. The imaging sequences needed for recording the MR images may be stored in a storage unit 16, along with all program modules needed to operate the MR system. Furthermore, the storage unit may have a program module, with which, as is explained below, the effective simulation or calculation of the stimulation limits is possible.

A recording unit 17 controls the image recording and thus controls the sequence of magnetic field gradients and RF pulses as a function of the selected imaging sequence. Thus, the recording unit 17 also controls the gradient controller 14 and the RF controller 15. MR images that may be displayed on a display 18 may be calculated in a computing unit 20, wherein an operator may operate the MR system by way of an input unit 19. The computing unit 20 is further designed, as is described in detail below, to perform a simulation of the electrical stimulation.

Figure 2:
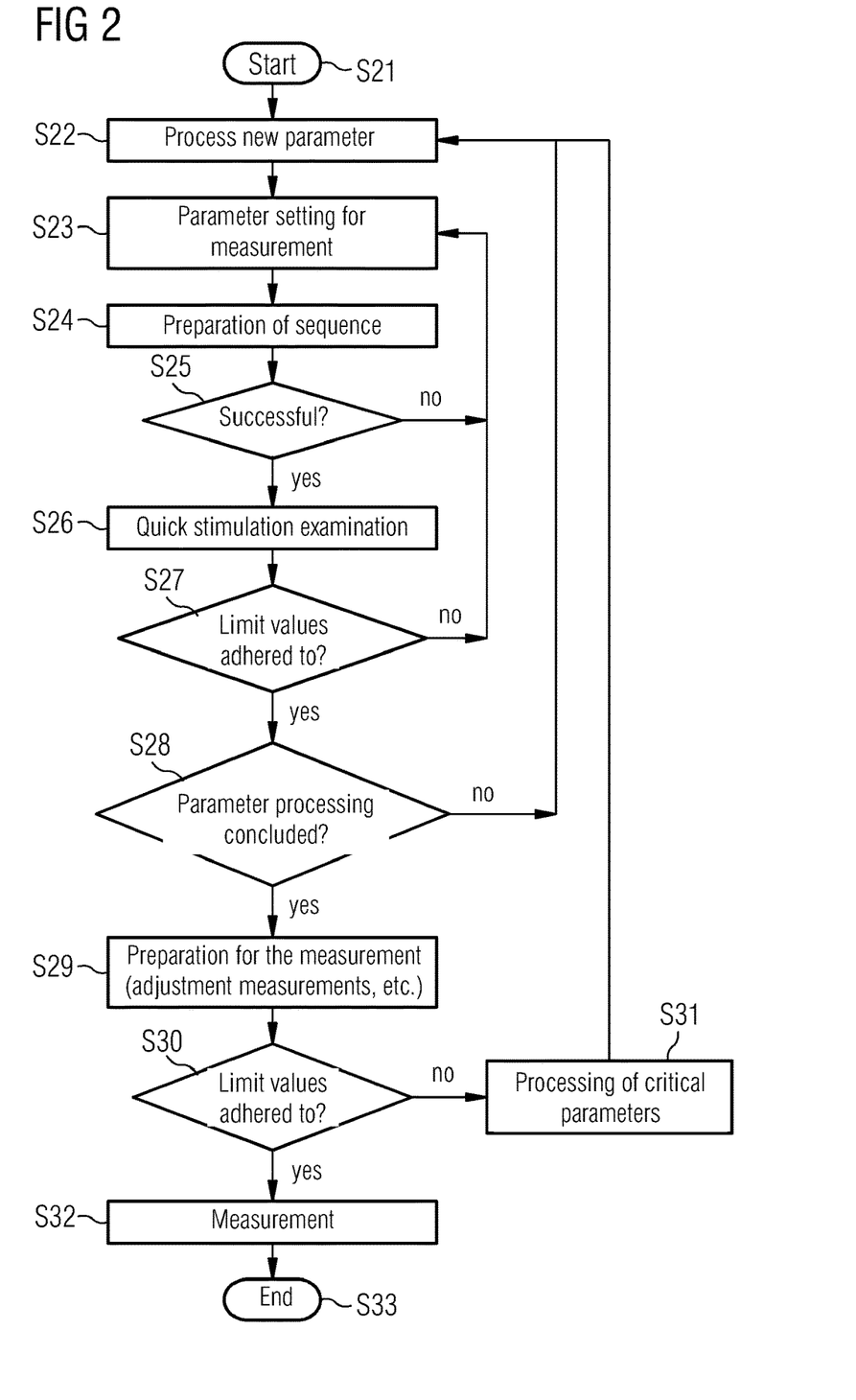
FIG. 2 depicts an example of a flow chart that makes clear in what context the improved simulation of the nerve stimulation takes place.

FIG. 2 depicts a flow diagram in which the disclosed stimulation examination is embedded. The method begins at act S21. In act S22, the processing or setting of an imaging parameter takes place following selection of an imaging sequence. In act S23, the parameter setting for the measurement is determined, (e.g., it is determined what field of view, what number of pixels, what echo time, etc., may be used). The preparation for the sequence takes place in act S24. Here the necessary magnetic field gradients and the time sequence of the RF pulses, which occur during the imaging sequence with the set imaging parameters, are determined. Act S25 examines whether the parameter setting was successful. Among other things, this means that an examination is made to see whether it is possible to perform the measurement using the set parameters. If not, the method returns to act S23. If the examination is executed successfully, the improved stimulation examination takes place in act S26. This act is explained in greater detail below in connection with FIGS. 3 and 4.

The calculation produces stimulation values and act S27 checks whether predefined limit values have been adhered to. If so, act S28 checks whether the parameter processing is concluded. If not, the method returns to act S22. If so, the preparation for the measurement is performed in act S29, e.g., among other things adjustment measurements are performed, in which the polarization field is adjusted to the examination object. After the measurement preparation has been performed, act S30 checks whether the stimulation limit values are still adhered to. If not, then in act S31, the critical imaging parameters are processed and the method returns to act S23.

If the check in act S30 depicts that the limit values have been adhered to, the measurement may be performed in act S32. The method finally ends in act S33.

Figure 3:
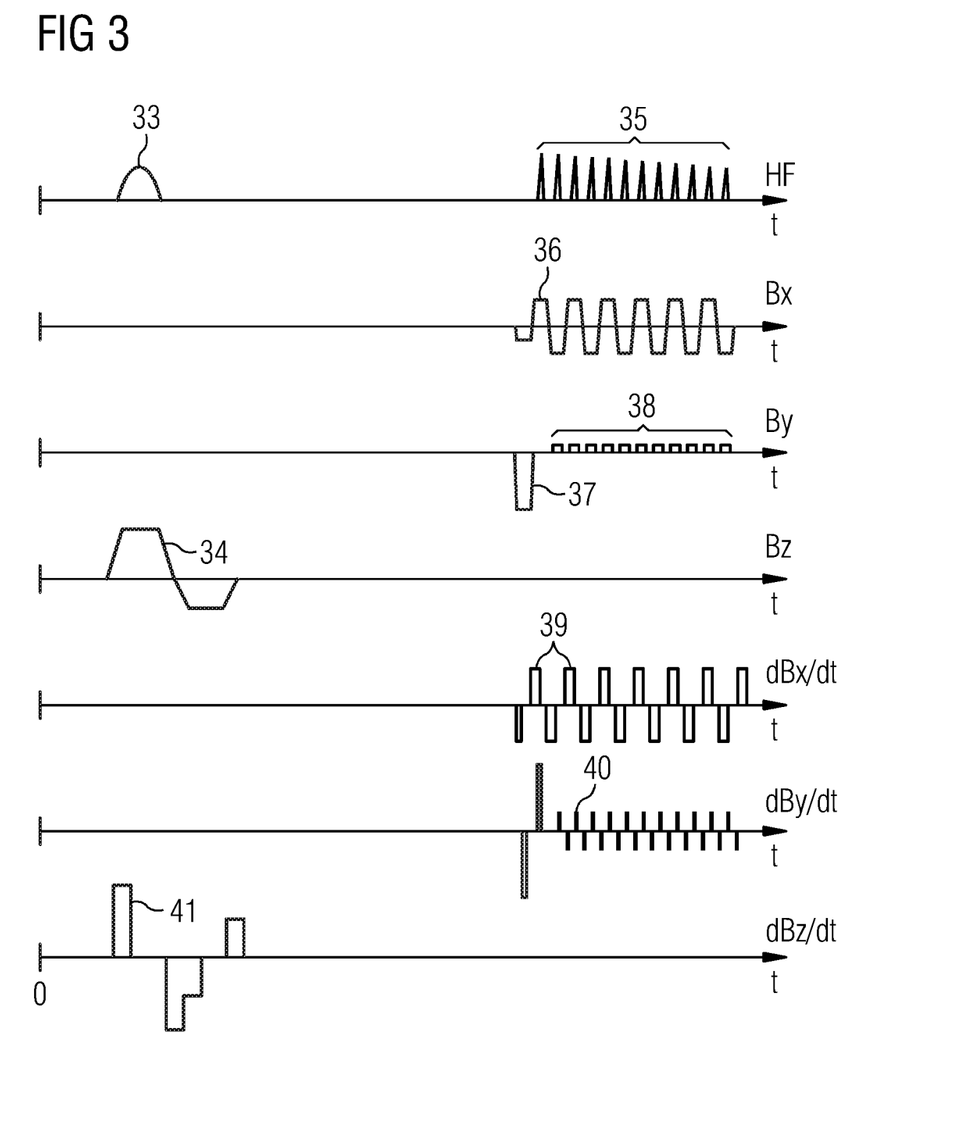
Figure 4:
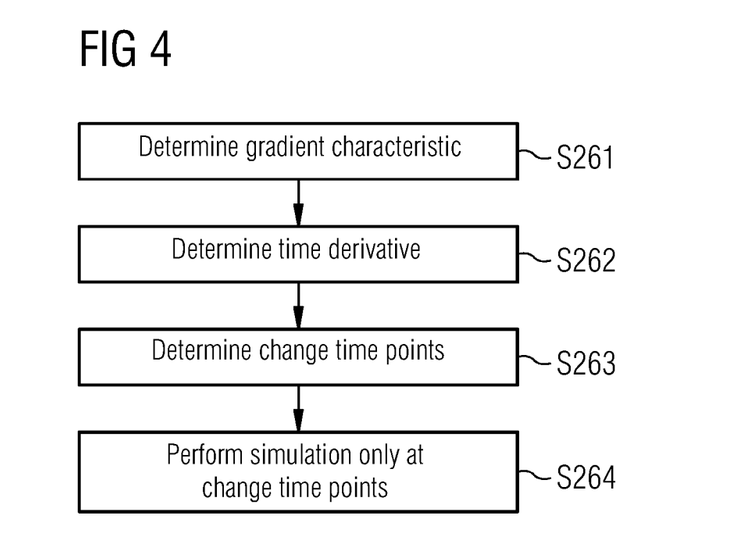
FIG. 4 depicts an example of a flow chart with the acts for performing a method for simulating the electrical stimulation.
Figure 5:
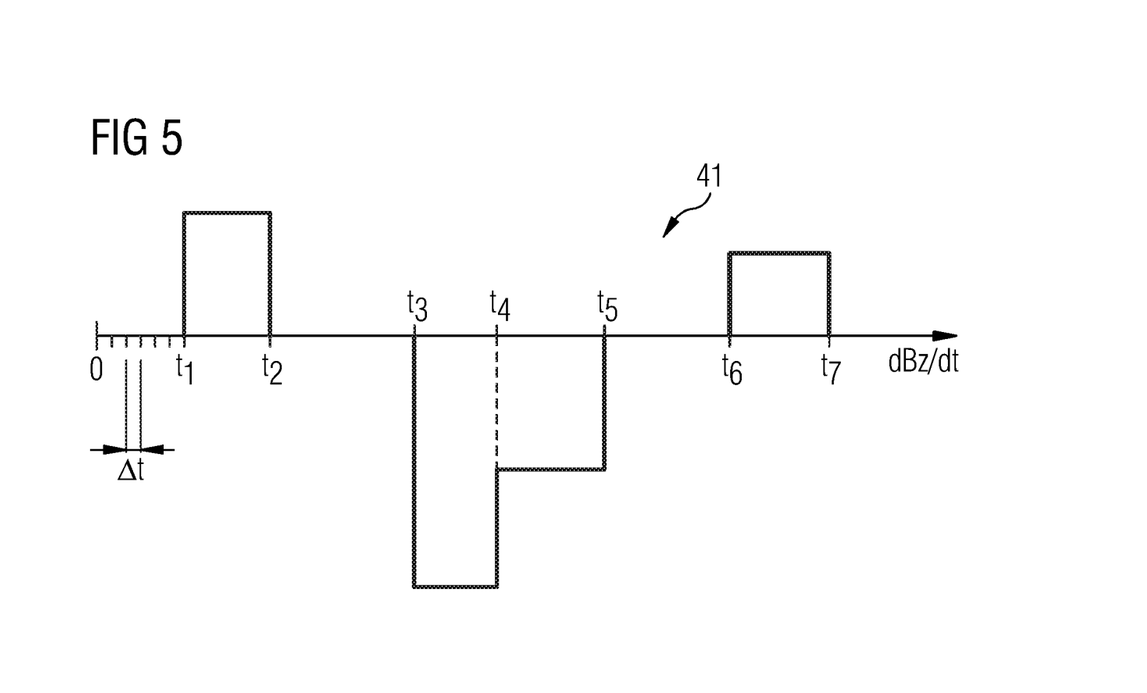

With reference to FIGS. 3 and 4, the improved simulation of the stimulation examination will now be explained. FIG. 3 schematically depicts the course of an imaging sequence, as may be used for imaging of the examination object. Following irradiation of an RF pulse 33 and the simultaneous switching of a magnetic field gradient in the slice selection direction, the gradient sequence 34, an RF pulse sequence 35 occurs. Simultaneously with the pulse sequence 35, a switching of magnetic field gradients in the read-out direction, the gradient sequence 36, takes place. The switching of the negative pre-gradient 37 and the gradient sequence 38 takes place in the phase encoding direction. The lower part of FIG. 3 depicts the time derivatives of the three magnetic field gradients used in each case. Sequence 39 is the time derivative of the magnetic field gradient in the read-out direction, whereas the time derivative of the gradient sequence 38 is illustrated in sequence 40. Finally, the time derivative of the gradient sequence 34 is shown in sequence 41. In the prior art, it was necessary to examine the entire time course of the imaging sequence with predefined time steps $\Delta t$, which, for example, may be 10 µs. As may be seen from FIG. 3, the simulation may be restricted to very few time points in the imaging sequence. This is illustrated more precisely in FIG. 5, wherein FIG. 5 depicts the time derivative of the gradients in the slice selection direction. FIG. 5 illustrates that the time derivative only changes at the time points t1 to t7. It is thus possible to reduce the calculation of the simulation in this gradient direction to these time points t1 to t7.

Following the formation of the time derivative in the various spatial directions of the magnetic field gradients used, a calculation may be performed, as is described in greater detail in U.S. Pat. No. 6,169,403 B1, herein incorporated by reference in its entirety. There filtering takes place using two filters, once for the simulation of the presynaptic phase and once for the simulation of the postsynaptic phase. The following function, which is subsequently derived, may now be used in this filtering, while the other calculation steps of the simulation may correspond to the steps as are described in U.S. Pat. No. 6,169,403 B1.

The simulation of the stimulation is based on filtering using an e-function via an iteration. Here the function at the time point of the imaging sequence at the time point zero is equal to 0:

$$f_0 = 0 \quad (1)$$

The filter value at the time point n·Δt is as follows:

$$f_n = d\dot{B} + c f_{n-1} \quad (2)$$

As shown in FIG. 5, Δt is a preset time step, which may be in the range of microseconds, for example 10 or 20 μs. $f_n$ is the filter value at the time point n, and $f_{n-1}$ describes the filter value at the previous time point. Defining parameters c and d as follows:

$$c = e^{\frac{-\Delta t}{\tau}}$$
$$d = 1 - c$$

gives the following equation:

$$f_n = d\dot{B} + c f_{n-1}. \quad (3)$$

τ is here a preset constant describing the filtering. With further considerations, the above equation (3) may be reformulated as follows:

$$f_n = d\dot{B} + c(d\dot{B} + c f_{n-2}) \quad (4)$$

$$f_n = (1+c)d\dot{B} + c^2 f_{n-2} \quad (5)$$

$$f_n = (1+c)d\dot{B} + c^2(d\dot{B} + c f_{n-3}) \quad (6)$$

$$f_n = (1+c+c^2)d\dot{B} + c^3 f_{n-3} \quad (7)$$

This results generally in the following equation:

$$f_n = d\dot{B} \sum_{k=0}^{i-1} c^k + c^i f_{n-i} \quad (8)$$

Assuming that the time derivative $\dot{B}$ is constant, as may be seen in equation (8), $\dot{B}$ may be moved in front of the sigma sign.

The following also applies:

$$\sum_{k=0}^{i-1} x^k = \frac{1-x^i}{1-x} \quad (9)$$

$$f_n = d\dot{B} \frac{1-c^i}{1-c} + c^i f_{n-i}$$

$$f_n = \dot{B}(1-c^i) + c^i f_{n-i} \quad (10)$$

$$f_n = \dot{B} + c^i (f_{n-i} - \dot{B}) \quad (11)$$

This results in the following equation for the filter value at the time point n:

$$f_n = \dot{B} + \left(e^{\frac{-\Delta t}{\tau}}\right)^i (f_{n-i} - \dot{B}) \quad (12)$$

This may be simplified still further as follows, using an approximation for the function:

Where (13)

$$e^x = 1 + \frac{x}{1!} + \dots$$

this gives $$f_n = \dot{B} + \left(1 - \frac{\Delta t}{\tau}\right)^i (f_{n-i} - \dot{B})$$

If Δt/τ is small enough, a further simplification of the exponential expression yields the following equation:

$$f_n = \dot{B} + \left(1 - \frac{i\Delta t}{\tau}\right)(f_{n-i} - \dot{B}) \quad (14)$$

Referring to FIG. 5, this means that one of the equations (12)-(14) need only be calculated for the time points t1 to t7 and not for each time point between the time step Δt. This means that filtering may be performed only at the time points t1 to t7, in relation to the slice selection direction, as is described in U.S. Pat. No. 6,169,403 B1 described above. Further time points emerge accordingly for the other two gradient directions.

FIG. 4 combines the acts that are performed during the quick stimulation examination in act S26. In act S261, the gradient characteristic is determined, wherein, in act S262, the time derivative of the magnetic field gradients used is determined, as is also illustrated in FIG. 3 by the characteristics 39-41. The change time points for each of the magnetic field gradients are then determined in act S263. For the slice selection direction these were the time points t1 to t7. Corresponding time points are likewise determined for the read-out direction and the phase encoding direction, thereby overall giving all time points at which the simulation of the stimulation may be performed. In act S264, the performance of the simulation may then be restricted to the change time points, as is described in greater detail in U.S. Pat. No. 6,169,403 B1.

Using the above derived formula, the errors that have hitherto arisen by rounding are reduced, so that the algorithm used becomes more accurate overall. In the current, iterative approach the result of the n−1 time point is used. By reference to the preceding values, small errors arising as a result of the finite computation/variable accuracy are added up over time. In the new approach proposed here, the value at the next change time point is calculated directly, rather than all small interim acts. Thus, if appropriate, e.g., 50 interim multiplications are avoided. Alternatively, any number of values of the exponential function may be calculated and stored at once:

$$e^{\frac{-i\Delta t}{\tau}}$$

is not sequence-dependent and may be stored for use in the calculation.

Overall the processing speed is increased so much that it is possible to calculate the entire gradient sequence. Thus, the permissible parameter space for the setting of the imaging parameters may be restricted prior to the measurement such that the stimulation value does not exceed a preset limit. This in turn expedites the operating procedure, because if a limit is exceeded it is no longer necessary to calculate suggestions from which a person has to select the most appropriate one. This work step may now be omitted.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for simulating an electrical stimulation during an examination of an examination object, in which the examination object is examined in a magnetic resonance (MR) system to create a MR image using an imaging sequence, the method comprising:
   determining, by a computing unit, a time characteristic of at least one magnetic field gradient used during the imaging sequence;
   determining, by the computing unit, a time derivative of the time characteristic of the at least one magnetic field gradient;
   determining, by the computing unit, change time points at which a value of the time derivative of the time characteristic of the at least one magnetic field gradient changes; and
   determining, by the computing unit, the simulation of the electrical stimulation for the imaging sequence, wherein the simulation is restricted to only the determined change time points.

2. The method of claim 1, wherein the simulation comprises an iterative calculation of the electrical stimulation, wherein the iterative calculation is restricted to the determined change time points.

3. The method of claim 2, wherein the iterative calculation determines a current stimulation value from a preceding stimulation value, wherein the iterative calculation of the current stimulation value is restricted to the determined change time points.

4. The method of claim 1, wherein the simulation of the electrical stimulation is performed for a whole time characteristic of the imaging sequence and for all gradient directions.

5. The method of claim 1, wherein the simulation of the electrical stimulation is based on the following formula:

$$f_n = \dot{B} + \left(e^{\frac{-\Delta t}{\tau}}\right)^i (f_{n-i} - \dot{B})$$

wherein $f_n$ is the electrical stimulation at a change time point n, $\Delta t$ is a predefined time step, $\tau$ is a predefined time constant, $f_{n-i}$ is the electrical stimulation at a preceding change time point, and $\dot{B}$ is the time derivative of the at least one magnetic field gradient.

6. The method of claim 5, wherein the exponential function used in the formula is approximated by a first-order function.

7. The method of claim 6, wherein the simulation assumes that $\Delta t/\tau$ is significantly less than 1.

8. The method of claim 5, wherein the simulation assumes that $\Delta t/\tau$ is significantly less than 1.

9. The method of claim 1, wherein the simulation is performed during setting of imaging parameters of the imaging sequence, and
   wherein the simulation is concluded before adjustment measurements are performed, in which an influence of the examination object on a measurement field in which the MR signals are measured is taken into account.

10. The method of claim 1, wherein a plurality of imaging parameters is set in the imaging sequence; and
    wherein, after setting of a first imaging parameter of the plurality of imaging parameters, the simulation is performed and concluded, before a next imaging parameter is set.

11. A magnetic resonance (MR) system configured to simulate an electrical stimulation during an examination of an examination object and create a MR image using an imaging sequence, the magnetic resonance system comprising:
    a computing unit configured to:
       determine a time characteristic of at least one magnetic field gradient used during the imaging sequence;
       determine a time derivative of the time characteristic of the at least one magnetic field gradient;
       determine change time points at which a value of the time derivative of the time characteristic of the at least one magnetic field gradient changes; and
       perform the simulation of the electrical stimulation for the imaging sequence, wherein the simulation is restricted to only the determined change time points.

12. The magnetic resonance system of claim 11, wherein performing the simulation by the computing unit comprises an iterative calculation of the electrical stimulation, wherein the iterative calculation is restricted to the determined change time points.

13. The magnetic resonance system of claim 11, wherein performing the simulation by the computing unit is based on the following formula:

$$f_n = \dot{B} + \left(e^{\frac{-\Delta t}{\tau}}\right)^i (f_{n-i} - \dot{B})$$

wherein $f_n$ is the electrical stimulation at a change time point n, $\Delta t$ is a predefined time step, $\tau$ is a predefined time constant, $f_{n-i}$ is the electrical stimulation at a preceding change time point, and $\dot{B}$ is the time derivative of the at least one magnetic field gradient.

14. The magnetic resonance system of claim 13, wherein exponential function used in the formula is approximated by a first-order function.

15. The magnetic resonance system of claim 13, wherein the simulation assumes that $\Delta t/\tau$ is significantly less than 1.

16. A non-transitory computer program configured to be loaded directly into a memory of a magnetic resonance (MR) control unit of a MR system, wherein the computer program when executed is configured to, with the MR control unit, cause the MR system to:
- determine a time characteristic of at least one magnetic field gradient used during an imaging sequence;
- determine a time derivative of the time characteristic of the at least one magnetic field gradient;
- determine change time points at which a value of the time derivative of the time characteristic of the at least one magnetic field gradient changes; and
- determine a simulation of an electrical stimulation for the imaging sequence, wherein the simulation is restricted to only the determined change time points.

17. An electronically readable data carrier with electronically readable non-transitory control information stored thereupon, wherein the electronically readable data carrier is configured to, when used in a magnetic resonance (MR) control unit of a MR system, cause the MR system to:
- determine a time characteristic of at least one magnetic field gradient used during an imaging sequence;
- determine a time derivative of the time characteristic of the at least one magnetic field gradient;
- determine change time points at which a value of the time derivative of the time characteristic of the at least one magnetic field gradient changes; and
- determine a simulation of an electrical stimulation for the imaging sequence, wherein the simulation is restricted to only the determined change time points.

\* \* \* \* \*